United States Patent
Reinberg

(10) Patent No.: US 6,265,281 B1
(45) Date of Patent: *Jul. 24, 2001

(54) METHOD FOR FORMING DIELECTRIC WITHIN A RECESS

(75) Inventor: Alan R. Reinberg, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/432,513

(22) Filed: Nov. 2, 1999

Related U.S. Application Data

(63) Continuation of application No. 08/912,050, filed on Aug. 18, 1997, now Pat. No. 5,976,947.

(51) Int. Cl.[7] ................................................. H01L 21/76
(52) U.S. Cl. ........................ 438/400; 438/424; 438/435; 438/436
(58) Field of Search ................................... 438/221, 294, 438/295, 296, 369, 361, 391, 426, 424, 427, 430, 431, 435, 437, 428, 436, 439

(56) References Cited

U.S. PATENT DOCUMENTS

| | | | |
|---|---|---|---|
| H204 | * 2/1987 | Oh et al. | 438/437 |
| 4,666,566 | 5/1987 | Fulton et al. | 438/431 |
| 4,952,524 | * 8/1990 | Lee et al. | 438/433 |
| 5,346,584 | 9/1994 | Nasr et al. | 438/431 |
| 5,786,263 | * 7/1998 | Perera | 438/431 |
| 5,858,858 | * 2/1999 | Park et al. | 438/424 |

FOREIGN PATENT DOCUMENTS

5055360 * 3/1993 (JP).

OTHER PUBLICATIONS

"Silicon Processing for the VLSI Era", vol. 2: Process Integration, by Stanley Wolf, PhD, Lattice Press, p. 68, copyright 1990.

* cited by examiner

*Primary Examiner*—Charles Bowers
*Assistant Examiner*—Thanhha Pham

(57) ABSTRACT

A method used during the formation of a semiconductor device comprises the steps of providing a semiconductor substrate assembly having at least one recess therein then forming a first dielectric layer within the recess. The first dielectric layer is formed with a thickness that will prevent the first dielectric layer from impinging on itself in the recess, for example with a thickness less than half a width of the trench. The dielectric layer is then annealed in a manner that will increase the volume of the first dielectric layer. After annealing the first dielectric layer, a second dielectric layer is formed over the first dielectric layer within the recess. The second dielectric layer is formed with a sufficient thickness such that it impinges on itself in the recess. The second dielectric layer is then annealed. Forming the dielectric layer within the recess using two or more deposition steps, and annealing between each deposition, reduces stresses to the substrate assembly and to the dielectric layer itself which can result in problems during subsequent processing.

13 Claims, 3 Drawing Sheets

METHOD FOR FORMING DIELECTRIC WITHIN A RECESS

This is a continuation of application Ser. No. 08/912,050 filed Aug. 18, 1997 and issued Nov. 2, 1999 as U.S. Pat. No. 5,976,947.

FIELD OF THE INVENTION

This invention relates to the field of semiconductor assembly, and more particularly to a method for forming a dielectric layer such as a trench isolation layer.

BACKGROUND OF THE INVENTION

A common structure formed during the manufacture of a semiconductor device such as memory, logic, microprocessors, etc., includes a shallow trench isolation structure. This structure can be formed by depositing a dielectric layer 10 such as a tetraethyl orthosilicate glass (TEOS) or borophosphosilicate glass (BPSG) based oxide or other dielectric in a narrow trench 12 in a substrate assembly 14 such as a monocrystalline silicon wafer as shown in FIG. 1. A typical use of this structure is to electrically isolate two adjacent active areas 16. During formation of the structure, for example using chemical vapor deposition (CVD), undesirable impurities such as carbon or unoxidized silicon can be introduced into the dielectric layer. To render the impurities functionally inert, a heating step such as an anneal can be performed to oxidize the impurities and also to anneal the oxide.

As shown in FIG. 2, annealing the dielectric causes it to expand from the addition of molecular oxygen. The original volume of the dielectric layer from FIG. 1 is depicted schematically in FIG. 2 as 20, while the volume after expansion is depicted as 22. Expansion will generally include a volume increase of from about 0.5% to about 5.0%, depending on the dielectric and the amount and composition of undesirable impurities in the dielectric. As the dielectric is annealed the expanding volume of the dielectric layer creates stress gradients 24 at the trench 12 in the substrate assembly 14 under the expanding the dielectric layer and also stresses the dielectric itself, for example along the midline of the trench, which results in difficulties during subsequent processing. For example, the dielectric under stress etches at a different rate than the nonstressed dielectric, as does the stressed substrate assembly when compared to the etch rate of the nonstressed substrate assembly.

A process which has been used to overcome this problem includes forming the dielectric such that it has a variation in its original thickness so that regions under stress are thinner than the nonstressed regions which will etch more quickly. Other processes which have been used to overcome this problem include flowing the dielectric, which requires an undesirably high temperature, and providing special cap layers that protect the dielectric during etching. These can be complicated, inconsistent processes which produce variable results.

A method for forming a dielectric layer which reduces or eliminates the problems described above would be desirable.

SUMMARY OF THE INVENTION

The present invention provides a new method which reduces problems associated with the manufacture of semiconductor devices, particularly problems resulting from stresses placed on dielectrics and substrate assemblies from expansion of a dielectric layer during annealing. In accordance with one embodiment of the invention used during the formation of a semiconductor device a semiconductor substrate assembly such as a semiconductor wafer having at least one recess therein is provided. A first dielectric layer is formed in the recess and is then heated, such as by annealing. Next, a second dielectric layer is formed directly on the first dielectric layer within the recess and the first and second layers are then heated or annealed.

By forming the dielectric layer in two separate steps, the first layer can be formed thin enough so that it does not impinge on itself and has adequate space to expand without stressing the substrate assembly or itself. The second dielectric layer is formed so that it does impinge on itself and is then annealed, but the volume increase and stress placed on the substrate assembly and the first and second dielectric layers are greatly reduced over prior processes.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
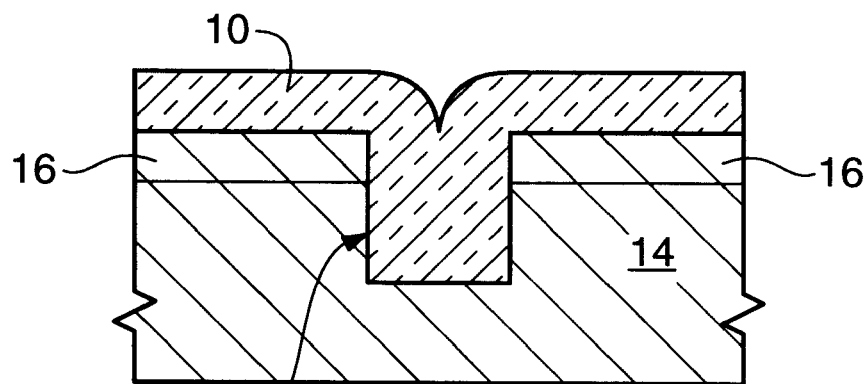
FIG. 1 is a cross section depicting a first step of a related art process having a dielectric layer formed within a trench in a semiconductor substrate assembly.
Figure 2:
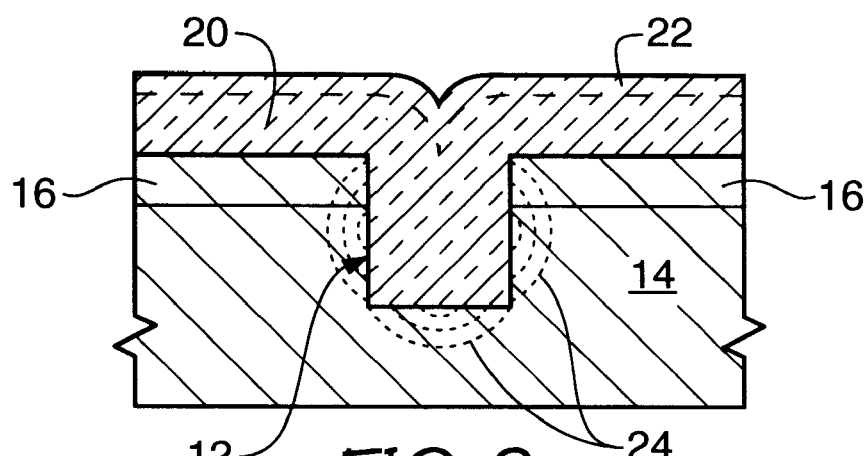
FIG. 2 is a cross section depicting the FIG. 1 structure after annealing the dielectric layer.
Figure 3:
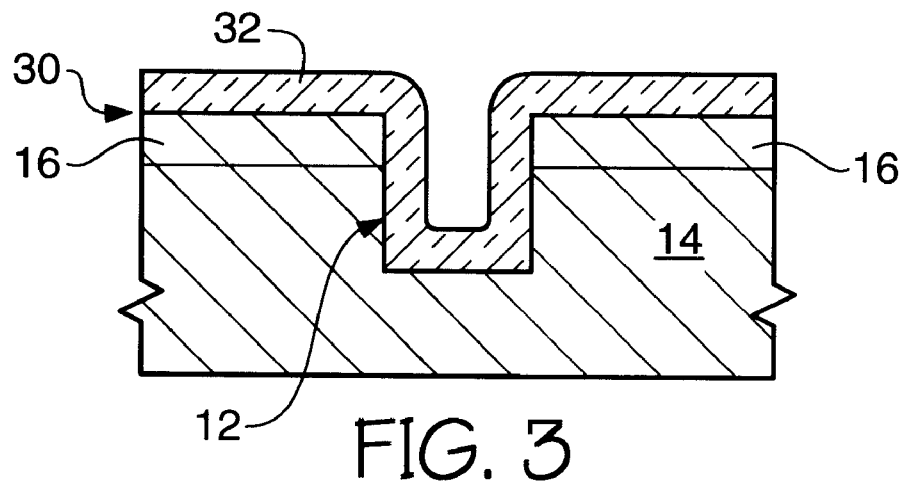
FIG. 3 is cross section a on depicting the formation of a first dielectric layer within a trench in a semiconductor substrate assembly of a first inventive embodiment.
Figure 4:
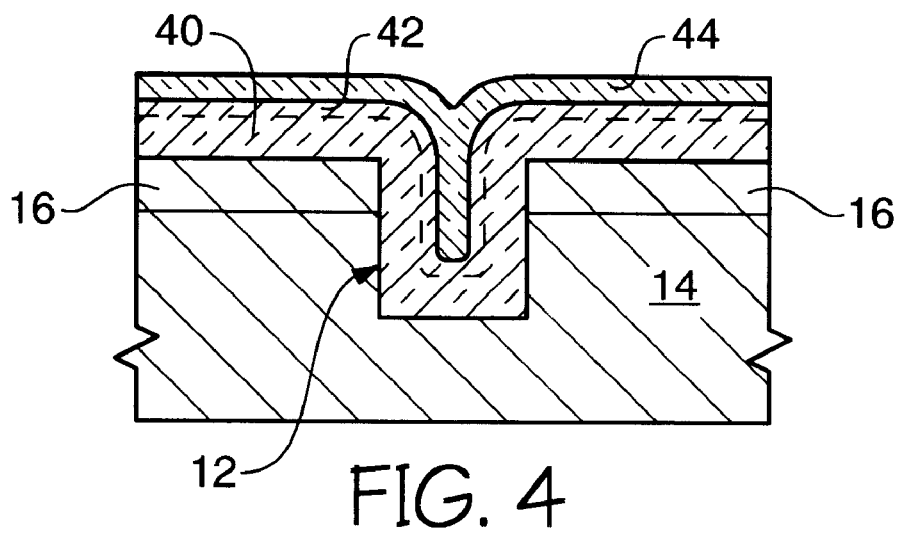
FIG. 4 depicts the FIG. 3 structure after annealing and the addition of a second dielectric layer.
Figure 5:
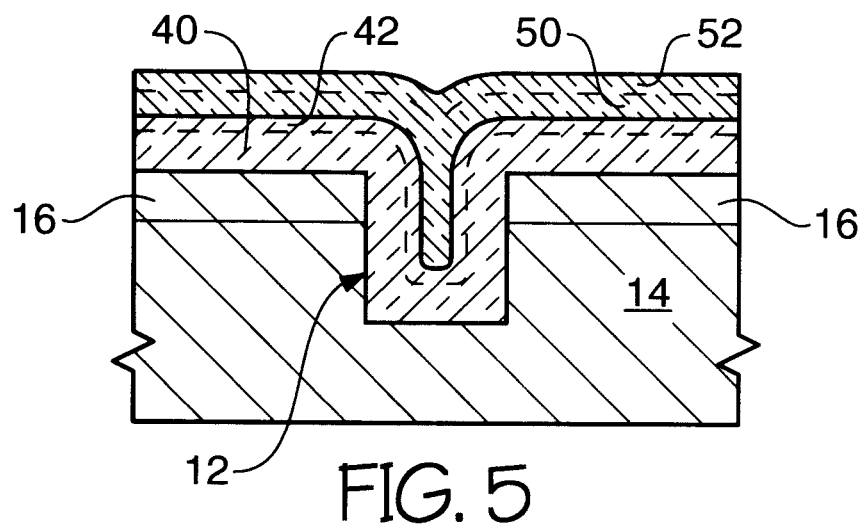
FIG. 5 depicts the FIG. 4 structure after annealing the second dielectric layer.

A first embodiment of an inventive method used during the formation of a semiconductor device is shown in FIGS. 3–5. As shown in FIG. 3, a semiconductor substrate assembly 14 such as a monocrystalline silicon wafer having a major surface 30 with at least one recess 12 therein is provided. The recess can be a trench such as that shown, or another depression or contour in the substrate assembly. FIGS. 3–5 show a particular use of the invention, a shallow trench isolation structure, in which the trench separates first and second active areas 16.

A first dielectric layer 32, for example a layer of silicon-rich TEOS, is formed at least within the recess 12 and preferably over the major surface 30 of the substrate assembly to form a blanket layer as shown in FIG. 3. The first dielectric layer 32 can be formed using a chemical vapor deposition (CVD) process. The first dielectric layer is formed so the trench is only partially filled, for example by forming the first dielectric layer such that its thickness is less than half the width of the trench so the first layer does not impinge on itself within the trench. For a trench 0.2 micrometers (μm) wide, a layer of between about 0.02 μm and about 0.08 μm, and preferably about 0.075 μm, would be sufficient. The trench depth will depend on the application. For shallow trench isolation using a trench 0.2 μm wide, the trench would be about 0.25 μm deep.

The first dielectric layer is heated, for example using an annealing process which changes the layer. Annealing the dielectric layer increases its volume resulting from the addition of oxygen to oxidize any unoxidized silicon atoms, and, in the case of BPSG, combines free boron or phosphorous atoms with oxygen. FIG. 4 depicts the volume of the first dielectric layer both before 40 and after 42 the annealing step. It should be noted that the mechanism which causes expansion of the material, as well as the material itself, may be different from that described herein. The invention is not to be limited by the mechanism of expansion of the material nor by the material itself except as provided for in the claims.

Annealing the dielectric layer is completed using a temperature that is below the glass transition temperature "Tg" where Tg is the temperature at which the shear viscosity of the dielectric is greater than about 104 poise. A TEOS layer having a thickness of about 0.08 μm can be annealed by heating it to a temperature of between about 950° C. and 1100° C., and preferably to a temperature of between 950° C. and 1050° C. (for example 1000° C.) in an oxygen-rich atmosphere for between about 20 minutes and about 40 minutes.

Subsequent to heating the first dielectric layer a second dielectric layer 44 is formed directly on the first dielectric layer 42 at least within the recess 12 and preferably over the major surface of the substrate assembly as shown in FIG. 4. The second dielectric layer is formed so the trench is completely filled (except for any keyholing or other anomalies which may occur), for example by forming the second dielectric layer such that the combination of the thickness of the first and second dielectric layers is at least half as thick as the width of the trench. With the above example of a trench having a width of 0.2 μm and a first dielectric thickness (before annealing) of about 0.075 μm, a second dielectric layer having a thickness of between about 0.050 μm and about 2.0 μm, and preferably about 1.0 μm, would be sufficient.

This second dielectric layer is annealed, for example with a process using a temperature less than Tg of the second dielectric layer, which increase the volume of the second dielectric layer. FIG. 5 depicts the volume of the second dielectric layer both before 50 and after 52 annealing. The volume of the first and second dielectric layers within the trench, in combination, fills the volume of the trench.

Figure 6:
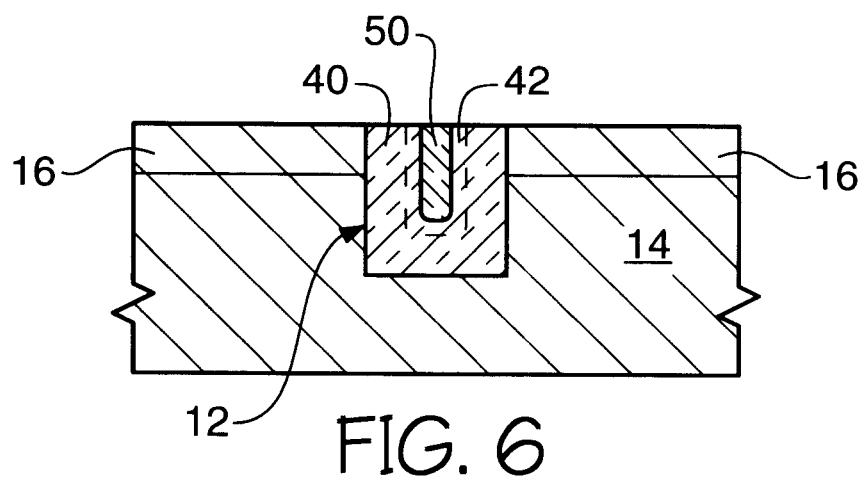
FIG. 6 depicts the FIG. 5 structure after removing portions of the first and second dielectric layers from the surface of the substrate assemblies.

Finally, for this inventive embodiment, the first and second layers extending over the major surface of the substrate assembly are etched and removed as shown in FIG. 6, for example using chemical mechanical planarization (CMP) or a wet or dry etch while at least portions of the first and second dielectric layers remain within the trench to provide an isolation structure.

In this embodiment, etching, patterning, or other processing of the first layer after its formation but prior to forming the second dielectric layer will not typically be performed, although an etch step or some other processing may be completed prior forming the second dielectric layer.

In another embodiment, the thickness of the first and second dielectric layers in combination can be less than half the thickness of the width of the trench, as long the two layers are at least half as thick as the width of the trench after annealing of the second layer.

In yet another embodiment, the first and second dielectric layers comprise two to different materials. For example, the first layer can comprise BPSG while the second layer comprises TEOS, or vice versa.

In still another embodiment, the layers within the trench can comprise more than two dielectric layers. For example, three (or more) layers can be formed which would require three (or more) annealing steps, with at least one annealing step being performed after each dielectric deposition.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, deeper trenches can profit from the instant invention if the fill process, for example using CVD, forms an adequately conformal layer. It is therefore contemplated that the appended claims will cover any such modifications or embodiments as fall within the true scope of the invention.

What is claimed is:

1. A method used during the formation of a semiconductor device comprising the following steps:
    providing a semiconductor substrate assembly having a recess therein defined by first and second semiconductor sidewalls, said recess comprising a width;
    only partially filling said recess with a first dielectric layer which contacts said semiconductor sidewalls;
    subsequent to partially filling said recess with said first dielectric layer, annealing said first dielectric layer;
    subsequent to annealing said first dielectric layer, providing a second dielectric layer within said recess which contacts said first dielectric layer; and
    annealing said second dielectric layer, wherein a thickness of said first dielectric layer prior to annealing said first dielectric layer added to a thickness of said second dielectric layer prior to annealing said second dielectric layer is less than half said width of said recess, and wherein, subsequent to annealing said second dielectric layer, said annealed first and second dielectric layers fill said recess.

2. The method of claim 1 wherein said step of annealing said first dielectric layer results in said first dielectric layer increasing in volume by about 0.5% to about 5.0%.

3. The method of claim 1 further comprising the step of heating said first dielectric layer to a temperature of between about 950° C. and about 1100° C. during said step of annealing said first dielectric layer.

4. The method of claim 1 further comprising the step of heating said first dielectric layer to a temperature of about 1000° C. during said step of annealing said first dielectric layer.

5. The method of claim 1 further comprising the step of heating said second dielectric layer to a temperature of between about 950° C. and about 1100° C. during said step of annealing said second dielectric layer.

6. The method of claim 1 further comprising the step of heating said second dielectric layer to a temperature of about 1000° C. during said step of annealing said second dielectric layer.

7. The method of claim 1 further comprising the steps of heating said first dielectric layer to a temperature of between about 950° C. and about 1100° C. during said step of annealing said first dielectric layer, and heating said second dielectric layer to a temperature of between about 950° C. and about 1100° C. during said step of annealing said second dielectric layer.

8. The method of claim 1 wherein said first and second annealing steps heat said first and second dielectric layers respectively to a temperature less than their glass transition temperatures.

9. A method used during the formation of a semiconductor device comprising the following steps:

providing a semiconductor substrate assembly having a recess therein defined by first and second semiconductor sidewalls;

only partially filling said recess with a first layer selected from the group consisting of tetraethyl orthosilicate and borophosphosilicate glass which contacts said first and second semiconductor sidewalls;

subsequent to partially filling said recess, annealing said first layer;

subsequent to annealing said first layer, providing a second layer selected from the group consisting of tetraethyl orthosilicate and borophosphosilicate glass which is different from said first layer within said recess which contacts said first layer; and annealing said second layer, wherein said first and second layers fill said trench.

10. The method of claim 9 wherein said step of providing said first layer comprises depositing said first layer as a blanket layer, and wherein said first blanket layer remains unetched prior to said step of providing said second layer.

11. The method of claim 10 wherein said step of providing said second layer comprises depositing said second layer as a blanket layer.

12. The method of claim 9 wherein said step of annealing said first layer and said step of annealing said second layer results in said first and second layers increasing in volume by about 0.5% to about 5.0%.

13. The method of claim 9 wherein said recess comprises a width and said first and second layers each comprise a thickness and said method further comprises the following steps:

during said step of only partially filling said recess with said first layer, providing said first layer having a thickness which is less than half as thick as said width of said recess;

during said step of annealing said first layer, expanding a volume of said first layer;

during said step of providing said second layer, providing said second layer having a thickness which is less than half as thick as said width of said recess, during said step of annealing said second layer, expanding a volume of said second layer such that subsequent to annealing said second layer, a thickness of said annealed first layer added to a thickness of said annealed second layer is at least half as thick as said width of said trench.

* * * * *